United States Patent
Shu et al.

(10) Patent No.: US 10,453,936 B2
(45) Date of Patent: Oct. 22, 2019

(54) METHODS OF FORMING REPLACEMENT GATE STRUCTURES ON TRANSISTOR DEVICES

(71) Applicant: GLOBALFOUNDRIES Inc., Grand Cayman (KY)

(72) Inventors: Jiehui Shu, Clifton Park, NY (US); Chang Seo Park, Ballston Lake, NY (US); Shimpei Yamaguchi, Ballston Lake, NY (US); Tao Han, Clifton Park, NY (US); Yong Mo Yang, Clifton Park, NY (US); Jinping Liu, Ballston Lake, NY (US); Hyuck Soo Yang, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/797,837

(22) Filed: Oct. 30, 2017

(65) Prior Publication Data

US 2019/0131429 A1 May 2, 2019

(51) Int. Cl.
*H01L 29/66* (2006.01)
*H01L 21/8234* (2006.01)
*H01L 27/088* (2006.01)

(52) U.S. Cl.
CPC .......... *H01L 29/66545* (2013.01); *H01L 21/823431* (2013.01); *H01L 21/823481* (2013.01); *H01L 27/0886* (2013.01); *H01L 21/823437* (2013.01)

(58) Field of Classification Search
CPC ....... H01L 29/66545; H01L 21/823431; H01L 21/823437; H01L 27/0886
See application file for complete search history.

(56) References Cited

U.S. PATENT DOCUMENTS

| 4,897,154 | A | * | 1/1990 | Chakravarti | ...... | H01L 21/02063 |
| | | | | | | 148/DIG. 3 |
| 8,536,040 | B1 | * | 9/2013 | Park | ...... | H01L 29/49 |
| | | | | | | 257/E21.198 |

(Continued)

FOREIGN PATENT DOCUMENTS

| TW | 201603270 A | 1/2016 |
| TW | 201621981 A | 6/2016 |

OTHER PUBLICATIONS

Final Office Action from related U.S. Appl. No. 15/797,723 dated May 31, 2019.

(Continued)

*Primary Examiner* — Ismail A Muse
*Assistant Examiner* — Charles N Ausar-El
(74) *Attorney, Agent, or Firm* — Amerson Law Firm, PLLC

(57) ABSTRACT

One illustrative method disclosed herein includes, among other things, forming a sacrificial gate structure above a semiconductor substrate, the sacrificial gate structure comprising a sacrificial gate insulation layer and a sacrificial gate electrode material, performing a first gate-cut etching process to thereby form an opening in the sacrificial gate electrode material and forming an internal sidewall spacer in the opening. In this example, the method also includes, after forming the internal sidewall spacer, performing a second gate-cut etching process through the opening, the second gate-cut etching process being adapted to remove the sacrificial gate electrode material, performing an oxidizing anneal process and forming an insulating material in at least the opening.

20 Claims, 11 Drawing Sheets

(56) References Cited

U.S. PATENT DOCUMENTS

| | | | |
|---|---|---|---|
| 8,647,972 B1 | 2/2014 | Ando et al. | |
| 9,048,262 B2 | 6/2015 | Adam et al. | |
| 9,064,890 B1 | 6/2015 | Xie et al. | |
| 9,070,635 B2* | 6/2015 | Liao | H01L 21/31116 |
| 9,147,748 B1* | 9/2015 | Xie | H01L 29/66545 |
| 9,236,480 B2 | 1/2016 | Xie et al. | |
| 9,318,574 B2 | 4/2016 | Cheng et al. | |
| 9,318,582 B2 | 4/2016 | Basker et al. | |
| 9,450,072 B2 | 9/2016 | Chou et al. | |
| 9,472,407 B2 | 10/2016 | Jagannathan et al. | |
| 9,508,642 B2* | 11/2016 | Bouche | H01L 23/528 |
| 9,515,070 B2 | 12/2016 | Horak et al. | |
| 9,659,779 B2 | 5/2017 | Cheng et al. | |
| 9,704,993 B2* | 7/2017 | Basker | H01L 29/6681 |
| 9,812,552 B2* | 11/2017 | Jun | H01L 21/76816 |
| 9,842,739 B2 | 12/2017 | Cheng et al. | |
| 10,083,961 B2* | 9/2018 | Bergendahl | H01L 27/0886 |
| 10,134,604 B1 | 11/2018 | Huang et al. | |
| 2010/0019292 A1 | 1/2010 | Kim et al. | |
| 2011/0195575 A1* | 8/2011 | Wang | H01L 21/02071 438/692 |
| 2011/0230052 A1* | 9/2011 | Tang | H01J 37/32091 438/723 |
| 2011/0298061 A1* | 12/2011 | Siddiqui | H01L 21/28088 257/410 |
| 2012/0164830 A1* | 6/2012 | Lee | H01L 21/02063 438/675 |
| 2012/0196447 A1* | 8/2012 | Yang | H01L 21/31116 438/734 |
| 2014/0367803 A1* | 12/2014 | Yu | H01L 29/785 257/412 |
| 2015/0054078 A1* | 2/2015 | Xie | H01L 29/785 257/347 |
| 2015/0129962 A1 | 5/2015 | Xie et al. | |
| 2016/0071799 A1 | 3/2016 | Hsieh et al. | |
| 2016/0172467 A1 | 6/2016 | Jang et al. | |
| 2016/0181383 A1* | 6/2016 | Huang | H01L 29/41758 257/757 |
| 2016/0315080 A1 | 10/2016 | Song et al. | |
| 2016/0380082 A1* | 12/2016 | Yu | H01L 29/66795 438/283 |
| 2017/0154995 A1 | 6/2017 | Ontalus | |
| 2017/0358684 A1* | 12/2017 | Chen | H01L 29/78391 |
| 2018/0047754 A1* | 2/2018 | Basker | H01L 21/823431 |
| 2018/0122643 A1 | 5/2018 | Cheng et al. | |
| 2018/0219080 A1* | 8/2018 | Clendenning | H01L 29/42364 |

OTHER PUBLICATIONS

Translation of Examination Report from Taiwan Patent Application No. 107117707 dated Apr. 3, 2019.

Office Action from related U.S. Appl. No. 15/797,723 dated Oct. 30, 2017.

* cited by examiner

METHODS OF FORMING REPLACEMENT GATE STRUCTURES ON TRANSISTOR DEVICES

BACKGROUND OF THE INVENTION

1. Field of the Invention

The present disclosure generally relates to the fabrication of integrated circuits, and, more particularly, to various novel methods of forming replacement gate structures on transistor devices and the resulting novel device structures.

2. Description of the Related Art

In modern integrated circuits, such as microprocessors, storage devices and the like, a very large number of circuit elements, especially transistors, are provided on a restricted chip area. Field Effect Transistors ("FETs") come in a variety of shapes and forms, e.g., planar transistors, FinFET transistors, vertical transistors, nanowire devices, etc.

A conventional planar FET is a planar device wherein the entire channel region of the device is formed parallel and slightly below the planar upper surface of the semiconducting substrate. In contrast to a planar FET, there are so-called 3D devices, such as an illustrative FinFET device, which is a three-dimensional structure. FIG. 1 is a perspective view of an illustrative prior art FinFET semiconductor device 10 that is formed above a semiconductor substrate 12 wherein the fins 14 of the device 10 are made of the material of the substrate 12, e.g., silicon. The device 10 includes a plurality of fin-formation trenches 13, three illustrative fins 14, a gate structure 16, a sidewall spacer 18 and a gate cap layer 20. The spacer 18 is typically made of silicon nitride, but in some cases it may be made of a material having a lower dielectric constant (k) than that of silicon nitride. An insulating material 17, e.g., silicon dioxide, provides electrical isolation between the fins 14. The fins 14 have a three dimensional configuration: a height H, a width W and an axial length L. The axial length L corresponds to the gate length of the device, i.e., the direction of current travel in the device 10 when it is operational. The gate width of the device 10 is orthogonal to the gate length direction. The portions of the fins 14 covered by the gate structure 16 are the channel regions of the FinFET device 10. The portions of the fins 14 that are positioned outside of the spacers 18 will become part of the source/drain regions of the device 10.

For many FET devices, the gate structures are initially formed as continuous line-type structures that extend across the entire substrate, including across both active regions and isolation regions. In advanced integrated circuit (IC) products, the gate structures for the transistor devices are typically manufactured using the well-known replacement gate (or "gate-last") manufacturing technique. In general, the replacement gate manufacturing technique involves the formation of a sacrificial (or "dummy") gate structure comprised of a sacrificial gate insulation layer (e.g., silicon dioxide) and a layer of a sacrificial gate electrode material (e.g., polysilicon or amorphous silicon). Various process operations are performed with the sacrificial gate structure in position, e.g., source/drain implantation processes, the formation of epi semiconductor material in the source/drain regions of the transistor devices, etc. At some point in the manufacturing process, the sacrificial gate structure will be removed to define a replacement gate cavity. Thereafter, materials for the replacement gate structure will be formed in the replacement gate cavity and a final gate cap will be formed over the replacement gate structure. In advanced devices, such a replacement gate structure may comprise a high-k (k value of 10 or greater) gate insulation layer and one or more metal-containing layers of material that collectively function as the conductive gate electrode for the replacement gate structure.

For many FET devices, the initial sacrificial gate structures are initially formed as continuous line-type structures that extend across the entire substrate, including across both active regions and isolation regions. The long continuous line-type sacrificial gate structures are formed by depositing the materials for the sacrificial gate structures across the entire substrate, forming a patterned gate etch mask above the deposited sacrificial gate materials and performing one or more etching processes through the patterned gate etch mask to remove the exposed portions of the sacrificial gate materials. At that point, a spacer structure will be formed adjacent the long continuous line-type sacrificial gate structures. As noted above, at some point after other processing has occurred, e.g., after formation of epi material in the source/drain regions of the devices, portions of the long continuous line-type sacrificial gate structures will be removed or "cut" so as to define individual portions or segments of the original long continuous line-type sacrificial gate structures which will eventually be removed and replaced with final replacement gate structures. After the cutting process is completed, there is "gate-cut" opening or space between the two cut end surfaces of the now-separated first and second sacrificial gate structures. This may sometimes be referred to as "tip-to-tip" spacing between the individual sacrificial gate structures. The gate-cut opening located between the cut end surfaces of the sacrificial gate structures is typically filled with an insulation material.

As device dimensions continue to decrease and as packing densities of transistor devices on a substrate continue to increase, various problems have arisen as it relates to manufacturing replacement gate structures on transistor devices. More specifically, as device scaling continues, the vertical height of the sacrificial gate structures has increased, while the lateral width (i.e., gate length or critical dimension) of the sacrificial gate structures has decreased. As a result, the aspect ratio (height/lateral width) has increased, thereby making the cutting of the original long continuous line-type sacrificial gate structures into individual sacrificial gate structure segments more problematic. For example, given the increased aspect ratio of the sacrificial gate structures on more advanced devices, the act of cutting the original long continuous line-type sacrificial gate structures may be incomplete in that undesirable residual amounts of the sacrificial gate material may remain in place after the cutting process is completed. The presence of such undesirable residual materials from the sacrificial gate structures may make the formation of quality replacement gate structures more difficult and, in some cases, constitute a conductive pathway between the final replacement gate structures that will be formed for the transistor devices. That is, residual conductive materials of the sacrificial gate structure that remains positioned at the bottom of the gate-cut opening may constitute an electrical short between the two final replacement gate structures when they are formed on the IC product, which may thereby result in decreased device performance and/or complete device failure.

The present disclosure is directed to various novel methods of forming replacement gate structures on transistor devices and the resulting novel device structures that may eliminate or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming replacement gate structures on transistor devices and the resulting novel device structures. One illustrative method disclosed herein includes, among other things, forming a sacrificial gate structure above a semiconductor substrate, the sacrificial gate structure comprising a sacrificial gate insulation layer and a sacrificial gate electrode material, performing a first gate-cut etching process to thereby form an opening in the sacrificial gate electrode material and forming an internal sidewall spacer in the opening. In this example, the method also includes, after forming the internal sidewall spacer, performing a second gate-cut etching process through the opening, the second gate-cut etching process being adapted to remove the sacrificial gate electrode material, performing an oxidizing anneal process and forming an insulating material in at least the opening.

One illustrative integrated circuit product disclosed herein includes a first final gate structure having a first end surface and a second final gate structure having a second end surface. In this embodiment, the integrated circuit product also includes an insulating gate separation structure positioned between the first and second final gate structures, wherein the first end surface contacts a first side surface of the insulating gate separation structure and the second end surface contacts a second side surface of the insulating gate separation structure. In this embodiment, the insulating gate separation structure has a stepped bottom surface with a substantially horizontally oriented bottom central surface that is surrounded by a substantially horizontally oriented recessed surface, wherein the substantially horizontally oriented bottom central surface is positioned a first level above the substrate and the substantially horizontally oriented recessed surface is positioned at a second level above the substrate, wherein the second level is greater than the first level.

BRIEF DESCRIPTION OF THE DRAWINGS

The disclosure may be understood by reference to the following description taken in conjunction with the accompanying drawings, in which like reference numerals identify like elements, and in which.

Figure 1:
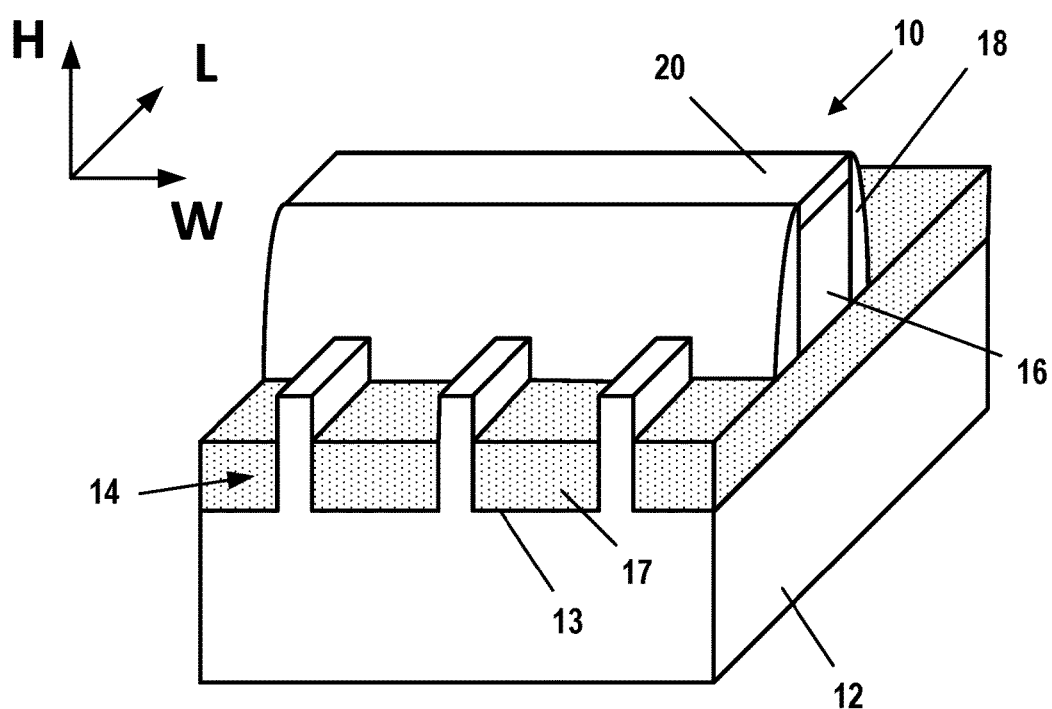
FIG. 1 is a simplistic depiction of an illustrative prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various novel methods of forming replacement gate structures on transistor devices and the resulting device structures. As will be readily apparent to those skilled in the art upon a complete reading of the present application, the presently disclosed methods may be employed when forming transistor devices having a variety of different configurations, e.g., planar transistor devices, vertical transistor devices, FinFET devices, etc. The illustrative examples described and depicted herein involve use of the methods disclosed herein to form an integrated circuit (IC) product 100 comprised of illustrative FinFET devices. However, the presently disclosed inventions should not be considered to be limited to any particular type or form of transistor device. Moreover, the methods and devices disclosed herein may be employed when forming a variety of products, including, but not limited to, logic products, memory products, etc. With reference to the attached figures, various illustrative embodiments of the methods and devices disclosed herein will now be described in more detail.

Figure 2:
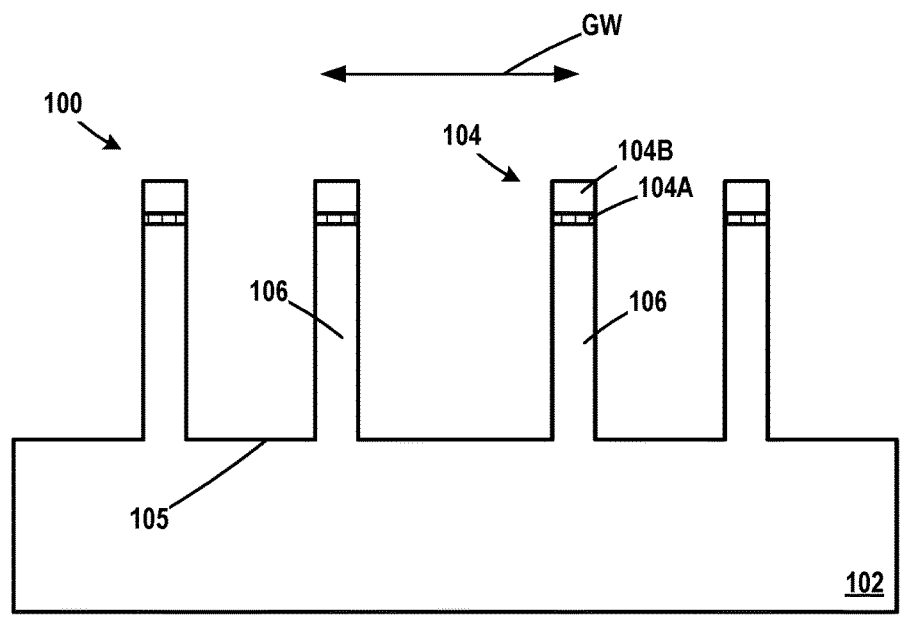
FIGS. 2-22 depict various novel methods disclosed herein related to the formation of replacement gate structures on transistor devices and the resulting device structures.

FIG. 2 depicts an IC product 100 that is formed in and above a semiconductor substrate 102. The substrate 102 may have a variety of configurations, such as the bulk substrate configuration depicted herein or a semiconductor-on-insulator (SOI) configuration. Such an SOI substrate includes a bulk semiconductor layer, a buried insulation layer positioned on the bulk semiconductor layer and an active semiconductor layer positioned on the buried insulation layer, wherein the transistor devices disclosed herein are formed in and above the active layer. The active layer and/or the bulk semiconductor layer may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials. It should be noted that the final gate structure for the transistor devices disclosed herein may be formed by performing well-known replacement gate manufacturing techniques. Additionally, various doped regions, e.g., halo implant regions, doped source/drain regions, well regions and the like, are not depicted in the attached drawings. The transistor devices depicted herein may be either NMOS or PMOS transistors. The various components and structures of the transistor devices disclosed herein may be formed using a variety of different materials and by performing a variety of known techniques, e.g., a chemical vapor deposition (CVD) process, an atomic layer deposition (ALD) process, a thermal growth process, spin-coating techniques, epi growth processes, etc. The thicknesses of these various layers of material may also vary depending upon the particular application.

As shown in FIG. 2, a plurality of fins 106 has been formed in the substrate 102. FIG. 2 is a cross-sectional view of the product 100 that is taken through the fins 106 at a location where gate structures (not shown) will be formed for first and second FinFET devices. The cross-sectional view in FIG. 2 is taken in a direction that corresponds to the gate width (GW) direction of the transistor devices.

With continuing reference to FIG. 2, in the example depicted herein, each of the illustrative FinFET devices will be depicted as comprising two illustrative fins 106. Of course, the FinFET devices may be comprised of a single fin 106 or more than the two illustrative fins 106 depicted herein. In one illustrative example, the fins 106 were formed by performing one or more etching processes, e.g., anisotropic etching processes, through a patterned fin-formation etch mask 104 to form a plurality of fin-formation trenches 105 in the substrate 102 and thereby define or form the plurality of fins 106. The patterned fin-formation etch mask 104 is intended to be representative in nature as it may be comprised of multiple layers of material, such as, for example, the depicted silicon dioxide layer 104A and the silicon nitride layer 104B. Thus, the particular form and composition of the patterned fin-formation etch mask 104 should not be considered a limitation of the presently disclosed inventions.

The lateral width and vertical height of the fins 106 may vary depending upon the particular application. Additionally, the overall size, shape and configuration of the fin-formation trenches 105 and the fins 106 may vary depending on the particular application. In the illustrative examples depicted in the attached drawings, the fin-formation trenches 105 and the fins 106 are all depicted as having a uniform size and shape. However, such uniformity in the size and shape of the trenches 105 and the fins 106 is not required to practice at least some aspects of the inventions disclosed herein. In the attached figures, the fin-formation trenches 105 are depicted as having been formed by performing an anisotropic etching process that results in the fins 106 having a schematically (and simplistically) depicted, generally rectangular configuration. In an actual real-world device, the sidewalls of the fins 106 may be somewhat outwardly tapered (i.e., the fins may be wider at the bottom of the fin than they are at the top of the fin) although that configuration is not depicted in the attached drawings. Thus, the size and configuration of the fin-formation trenches 105 and the fins 106, and the manner in which they are made, should not be considered a limitation of the presently disclosed inventions. For ease of disclosure, only the substantially rectangular trenches 105 and fins 106 will be depicted in the subsequent drawings.

Figure 3:
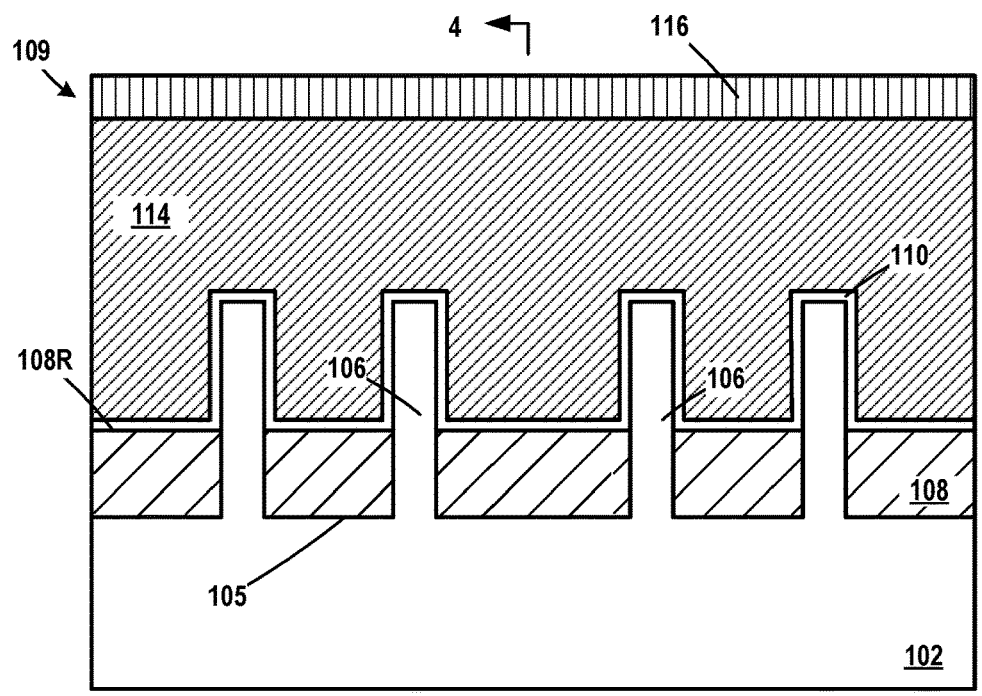

FIG. 3 depicts the product 100 after several process operations were performed. First, a layer of insulating material 108, such as silicon dioxide, was deposited so as to overfill the trenches 105 such that insulating material 108 was positioned above the upper surface of the patterned etch mask 104. Thereafter, a CMP process was performed to planarize the upper surface of the deposited layer of insulating material 108 with the upper surface of the patterned etch mask 104. Then, a recess etching process was performed to recess the layer of insulating material 108 such that it has a recessed upper surface 108R that exposes a desired portion or amount of the vertical height of the fins 106. The amount of recessing of the layer of insulating material 108 may vary depending upon the particular application. Thereafter, one or more etching processes were performed to remove the patterned etch mask 104 relative to the surrounding materials.

As noted above, the final gate structures for the transistor devices will be manufactured using a unique replacement gate manufacturing process disclosed herein. Part of the process of forming replacement gate structures involves forming a sacrificial gate structure 109 that is removed and replaced with a final replacement gate structure after various process operations are performed to fabricate the transistors with the sacrificial gate structure 109 in position. Accordingly, still referencing FIG. 3, such a sacrificial gate structure 109 typically comprises a sacrificial gate insulation layer 110 and a sacrificial gate electrode 114. A gate cap 116 is typically positioned above the sacrificial gate structure 109. As shown in FIG. 3, in one illustrative process flow, a conformal deposition process, e.g., a conformal ALD process, was performed to form a conformal sacrificial gate insulation layer 110 on the product 100. Alternatively, the conformal sacrificial gate insulation layer 110 could also be formed by performing a thermal growth process. The thickness and material of construction for the sacrificial gate insulation layer 110 may vary depending upon the particular application. In one illustrative embodiment, the sacrificial gate insulation layer 110 may be comprised of silicon dioxide. In the depicted example, wherein the illustrative transistor devices are FinFET devices, a conformal deposition process was performed to form the sacrificial gate insulation layer 110. However, the formation of such a conformal sacrificial gate insulation layer 110 may not be required in all applications. For example, when the transistor devices are planar devices, the sacrificial gate insulation layer 110 may be formed by forming a non-conformal deposition process or a thermal growth process.

Also shown in FIG. 3 is the sacrificial gate electrode 114 of the sacrificial gate structure 109 as formed on the sacrificial gate insulation layer 110. In one illustrative example, the sacrificial gate electrode 114 may be comprised of a single layer of material. The thickness and material of construction of the sacrificial gate electrode 114 may vary depending upon the particular application. In one illustrative example, the sacrificial gate electrode 114 may be comprised of polysilicon, amorphous silicon, etc. In one illustrative process flow, a blanket deposition process was performed to form the sacrificial gate electrode 114 on the sacrificial gate insulation layer 110. Although not depicted in the drawings, after the material for the sacrificial gate electrode 114 is initially deposited, its upper surface may be uneven, as it will tend to have high spots at locations above the fins 106 and low spots in areas between the fins 106, i.e., its upper surface will comprise peaks and valleys. Ultimately, it is desirable that the upper surface of the sacrificial gate electrode 114 be substantially planar prior to performing additional process operations. In one embodiment, this may be accomplished by forming a relative thin layer of silicon dioxide so as to overfill the valleys in the upper surface of the layer of material for the sacrificial gate electrode 114, performing a CMP process to planarize the upper surfaces of the silicon dioxide and the sacrificial gate electrode material layer 114, and thereafter performing an etching process that is non-selective relative to the layer of silicon dioxide and the layer of material for the sacrificial gate electrode 114. This etching process is performed until all of the silicon dioxide material is removed, thereby leaving the layer of material for the sacrificial gate electrode 114 with the substantially planar upper surface depicted in FIG. 3. Thereafter, a gate cap material layer 116 (e.g., silicon nitride) was blanket deposited across the substrate 102 on the layer of material for the sacrificial gate electrode 114.

Figure 4:
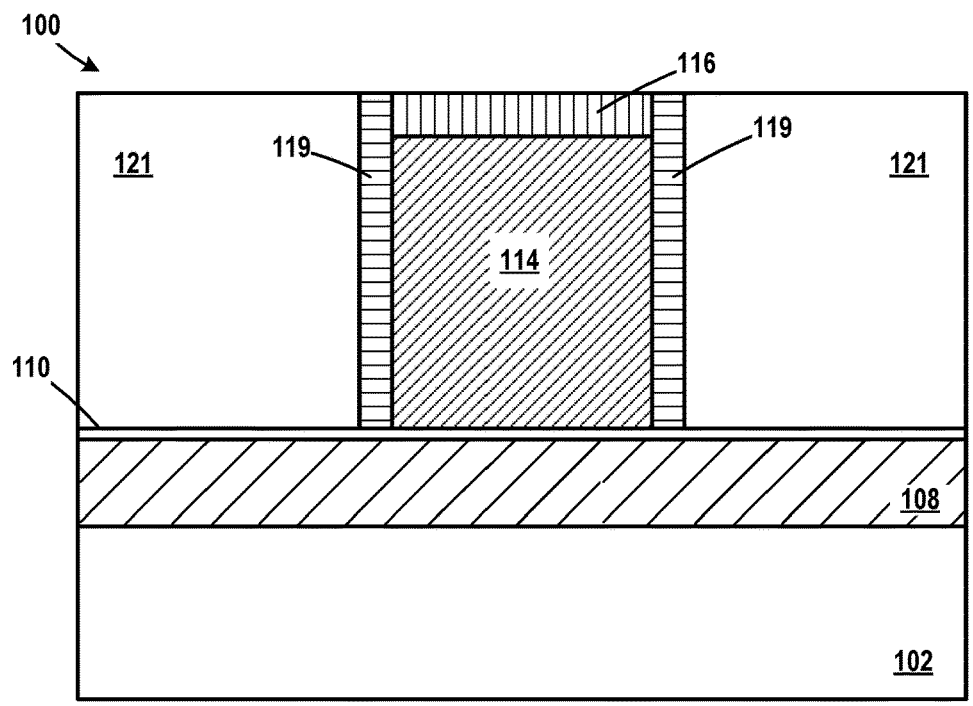

In one illustrative process flow, all of the layers of material 110, 114 and 116 were initially formed above the entire substrate 102. At that point, in the illustrative process flow depicted herein, a plurality of etching processes was performed to pattern at least the layers 116 and 114 to form a plurality of separate continuous line-type structures that extend across the substrate 102. FIG. 4 is a cross-sectional view taken where indicated in FIG. 3 in a direction corresponding to the gate length (current transport) direction of the transistor devices. In some applications, the layer 110 may also be patterned at this point in the process flow, but such a situation is not depicted in the drawings. This may be accomplished by forming a patterned photoresist etch mask (not shown) that is comprised of a plurality of line-type features above the gate cap material layer 116 and thereafter performing one or more etching processes through the patterned photoresist etch mask to remove the exposed portions of the gate cap material layer 116. Each of the individual features of the patterned gate cap material layer 116 may serve as a gate cap for one of the continuous line-type sacrificial gate structures 109 comprised of at least the sacrificial gate electrode 114 after the completion of the etching processes. At that point, the patterned photoresist etch mask may be removed and the patterned gate cap material layer 116 may serve as an etch mask to pattern at least the layer of material for the sacrificial gate electrode 114 to thereby form a plurality of the continuous line-type sacrificial gate structures 109, each of which has a gate cap 116 positioned there above. Then, as shown in FIG. 4, a sidewall spacer 119 may be formed adjacent the sidewalls of each of the continuous line-type sacrificial gate structures 109 by performing traditional spacer manufacturing techniques, i.e., depositing a conformal layer of spacer material and performing an anisotropic etching process. With reference to FIG. 4, a layer of insulating material 121, e.g., silicon dioxide, was then deposited on the product 100 and a CMP process was performed to planarize the upper surface of the layer of insulating material 121 with the upper surface of the gate cap 116.

Figure 5:
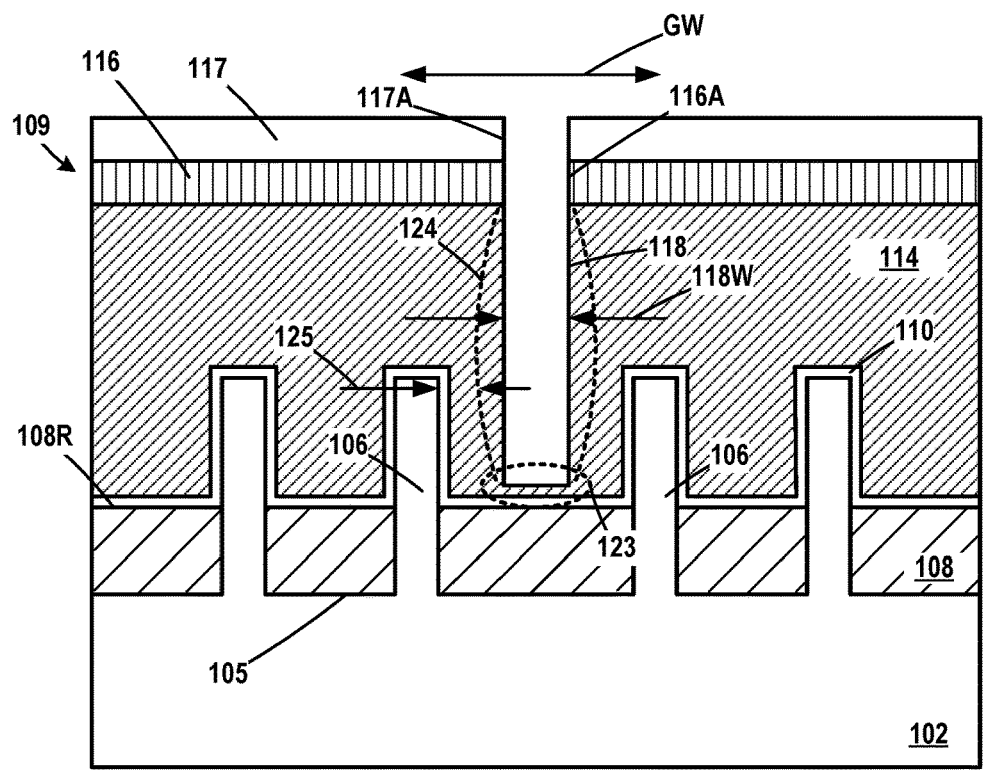

FIG. 5 depicts the product 100 after several process operations were performed. First, a patterned mask layer 117, e.g., a patterned layer of photoresist, with an opening 117A formed therein, was formed above the gate cap 116 and the layer of insulating material 121. The opening 117A is positioned at a location where it is desired to cut or remove the materials of the sacrificial gate structure 109. With continuing reference to FIG. 5, an anisotropic etching process was performed through the opening 117A to remove exposed portions of the gate cap 116 and define an opening 116A in the gate cap 116. This etching process may also reduce the height of the spacer 119, but such height reduction of the spacer 119 is not depicted in the drawings. In general, one aspect of at least some of the inventions disclosed herein involves performing a two-step gate etch process to cut or separate at least the sacrificial gate electrode 114 of the sacrificial gate structure 109 into desired segments of varied axial lengths. Accordingly, FIG. 5 depicts the product at a point wherein a first anisotropic gate-cut etching process was performed though the opening 116A to remove portions of the sacrificial gate electrode 114 and thereby define an opening 118 with a lateral width (in the gate width (GW) direction of the transistor devices). The first gate-cut etching process was, in a relative sense, a relatively non-aggressive etching process such that the opening 118 maintains an approximately constant width 118 W from the top to the bottom of the opening 118 and exhibits substantially planar sidewalls when viewed in cross-section. Of course, in a real-world device, the opening 118 may be tapered to some degree, i.e., it may be wider at the top of the opening 118 than it is at the bottom of the opening 118. For example, in the case where the sacrificial gate electrode 114 is made of polysilicon or amorphous silicon, the first gate-cut etching process may be performed using at least one halogen-based material as the etchant, and the etching process may be performed at a power of less than or equal to about 500 W. In one embodiment, the first gate-cut etching process is performed such that the opening 118 has a bottom that stops within the sacrificial gate electrode material 114. That is, as a result of performing this relatively non-aggressive first gate-cut etching process, there may be some remaining material of the sacrificial gate electrode 114 at the bottom of the opening 118, as indicated in the dashed line region 123. The amount remaining of the material of the sacrificial gate electrode 114 at bottom of the opening 118 may vary depending upon the particular application. However, if a more aggressive etching process were performed (using, for example, a power setting greater than 500 W) in an attempt to insure that all of the material of the sacrificial gate electrode 114 was removed, then the sidewalls of the opening 118 would tend to bow outward, as indicated by the dashed lines 124. Such bowed sidewalls can be problematic in that the spacing 125 between the bowed sidewalls 124 and the nearest fin 106 would be less than the corresponding spacing between the fin 106 and the substantially non-bowed sidewalls of the opening 118 when the opening 118 was formed using the relatively non-aggressive first gate-cut etching process described above. The reduced spacing 125 when the opening 118 is formed with outwardly bowed sidewalls 124 can make the formation of the final gate structures for the devices more challenging given the relatively small spacing 125 between the fins 106 and an insulating gate separation structure 141 that will be formed in the opening 118, as described more fully below.

Figure 6:
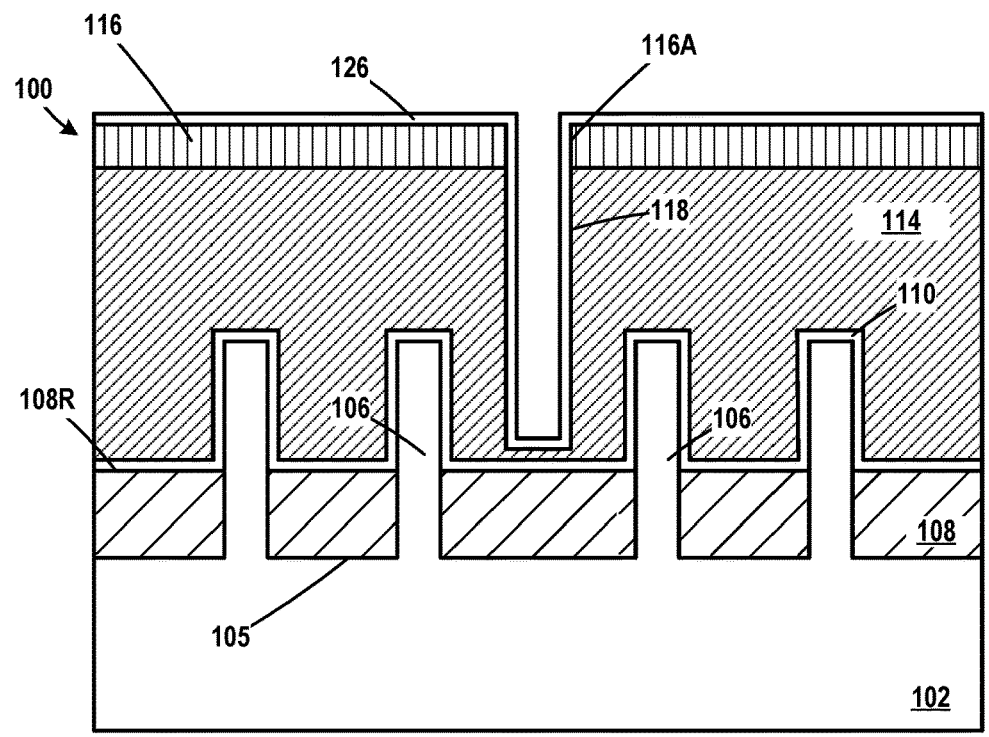

FIG. 6 depicts the product 100 after several process operations were performed. First, the patterned etch mask 117 was removed. Thereafter, a conformal deposition process was performed to form a conformal layer of spacer material 126 above the gate cap 116 and in the opening 118. The layer of spacer material 126 may be made of any desired material, e.g., silicon nitride, silicon oxynitride, etc.

Figure 7:
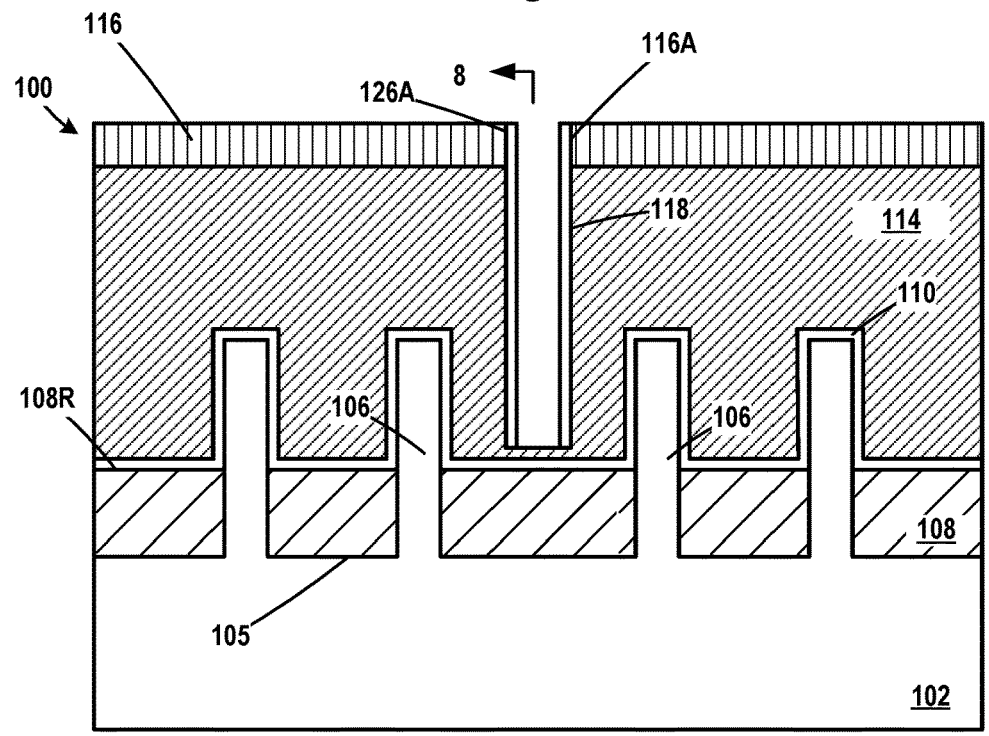
Figure 8:
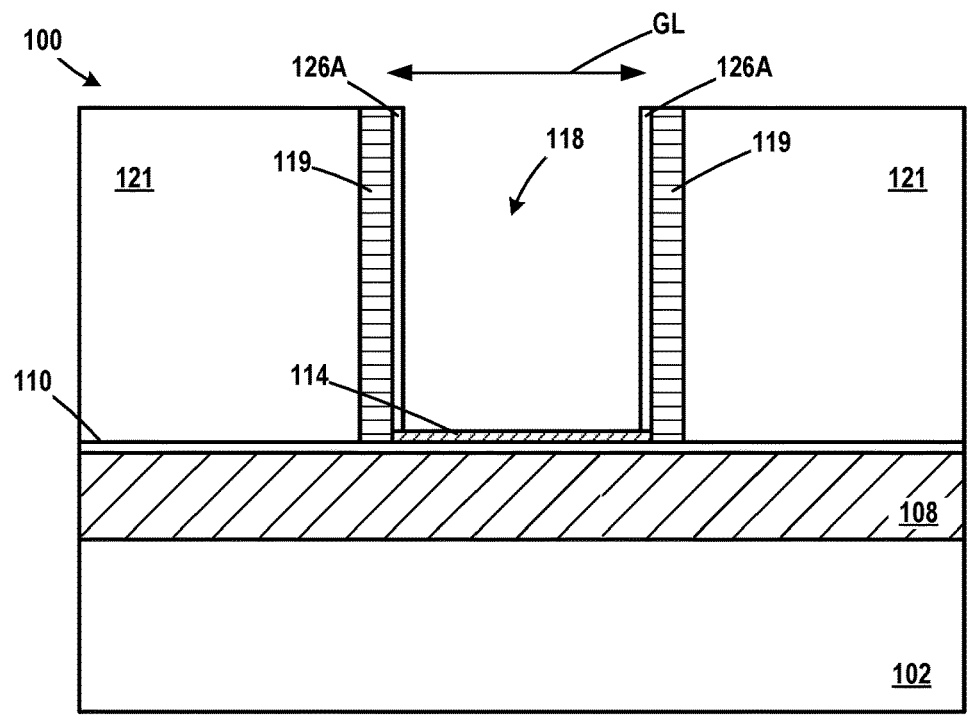

FIGS. 7 and 8 depict the product after an anisotropic etching process was performed to remove the horizontally positioned portions of the layer of spacer material 126, thereby forming an internal sidewall spacer 126A positioned on the sidewalls of the opening 118. FIG. 8 is a cross-sectional view taken where indicated in FIG. 7 in a direction corresponding to the gate length (GL or current transport) direction of the transistor devices. The thickness of the internal spacer 126A (at its base) may vary depending upon the particular application (e.g., 2-5 nm). By forming the internal spacer 126A, a significant portion of the residual portion of the material for the sacrificial gate electrode 114 positioned at the bottom of the opening 118 is again exposed within the area defined by the inside surfaces of the spacer 126A. However, as depicted, a portion of the material for the sacrificial gate electrode 114 is still positioned under or covered by the internal spacer 126A.

Figure 9:
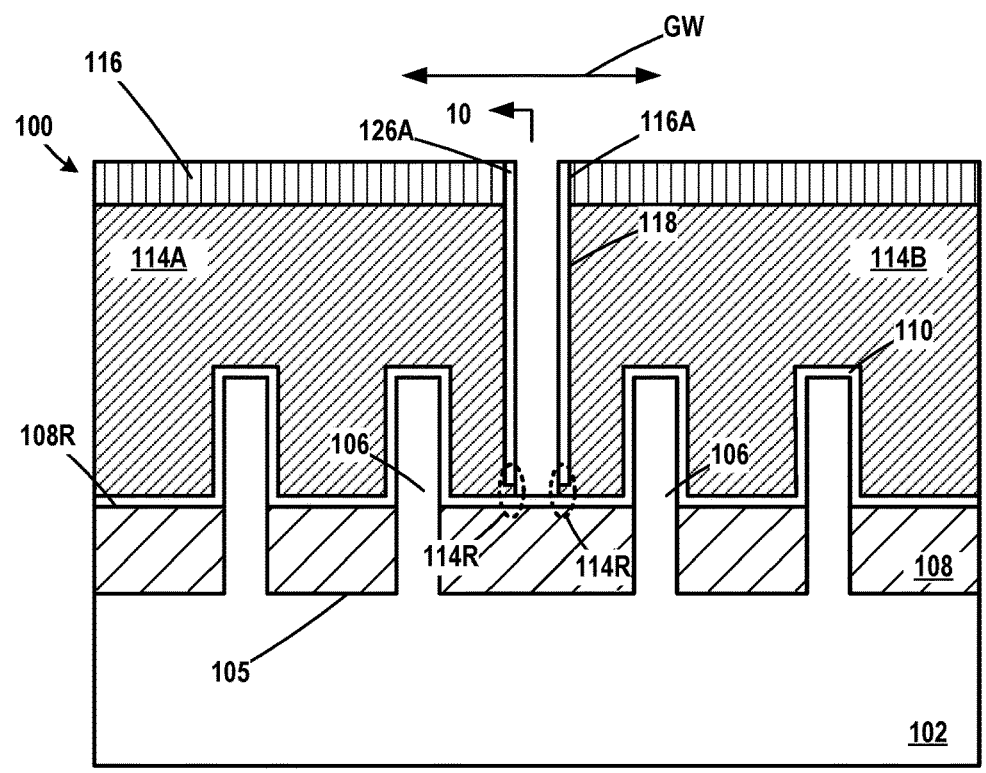
Figure 10:
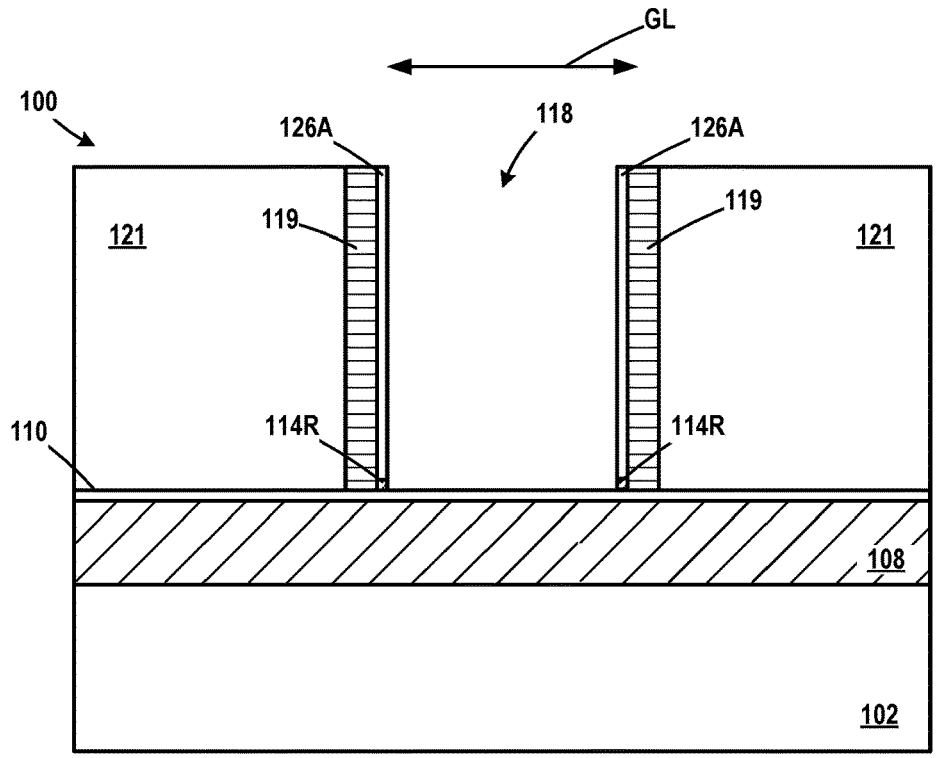
Figure 11:
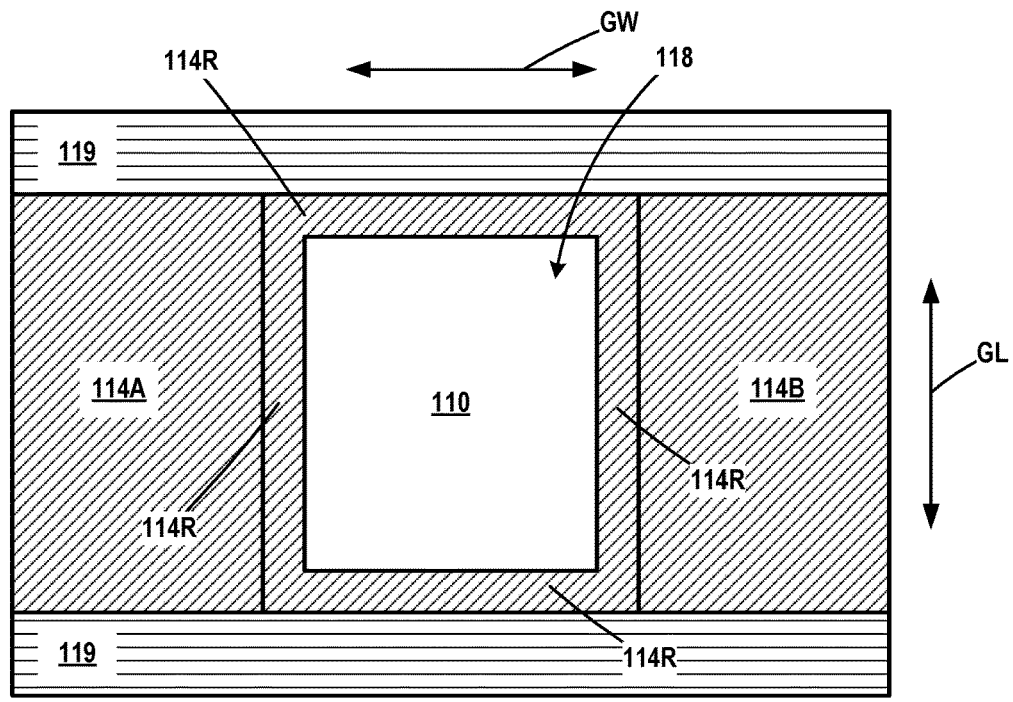

FIGS. 9, 10 and 11 depict the product after a second anisotropic gate-cut etching process was performed though the opening 118, with internal spacer 126A positioned therein, to remove exposed portions of the sacrificial gate electrode 114 that are not covered by the internal spacer 126A selectively relative to the surrounding materials. FIG. 10 is a cross-sectional view taken where indicated in FIG. 9 in a direction corresponding to the gate length (current transport) direction of the transistor devices. FIG. 11 is an enlarged plan view looking downward into the opening 118 with the internal spacer 126A removed, wherein arrows indicate the gate-length (GL) and gate-width (GW) directions of the transistor devices. In one illustrative embodiment, the second anisotropic gate-cut etching process stops on the sacrificial gate insulation layer 110 and effectively extends the depth of the opening 118. As depicted, after the completion of the second gate-cut etching process, the material for the sacrificial gate electrode 114 is essentially cut into a first portion 114A and a second portion 114B except for the remaining portion 114R of the material of the sacrificial gate electrode 114 positioned under the internal spacer 126A. At this point in the process flow, if desired, an etching process may be performed to remove the exposed portions of the sacrificial gate insulation layer 110 positioned at the bottom of the opening 118.

Figure 12:
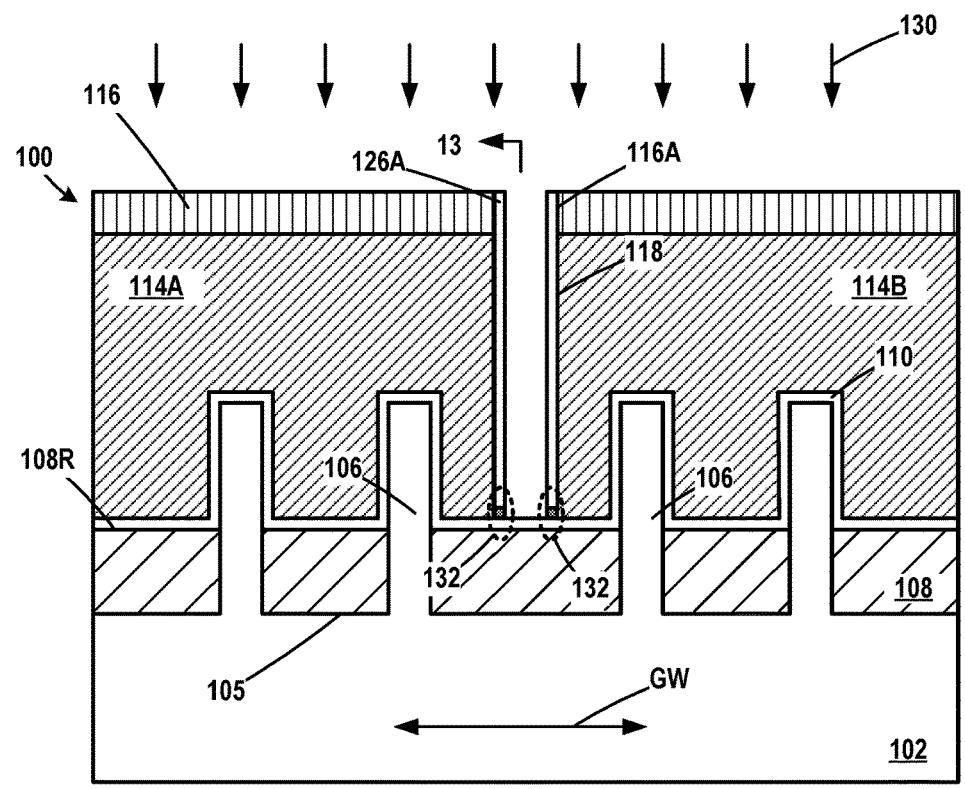
Figure 13:
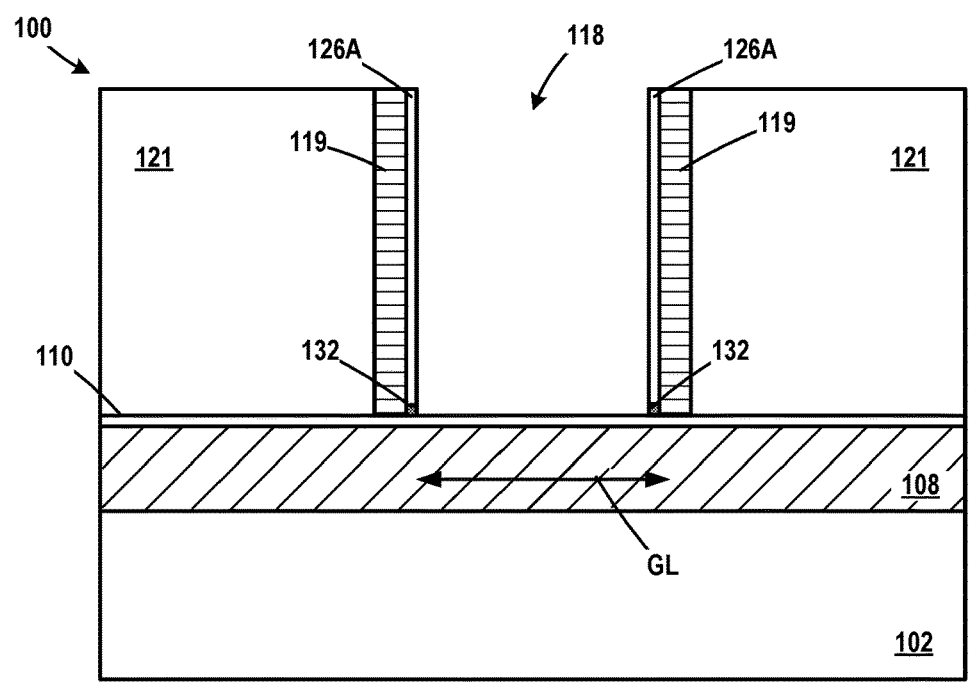
Figure 14:
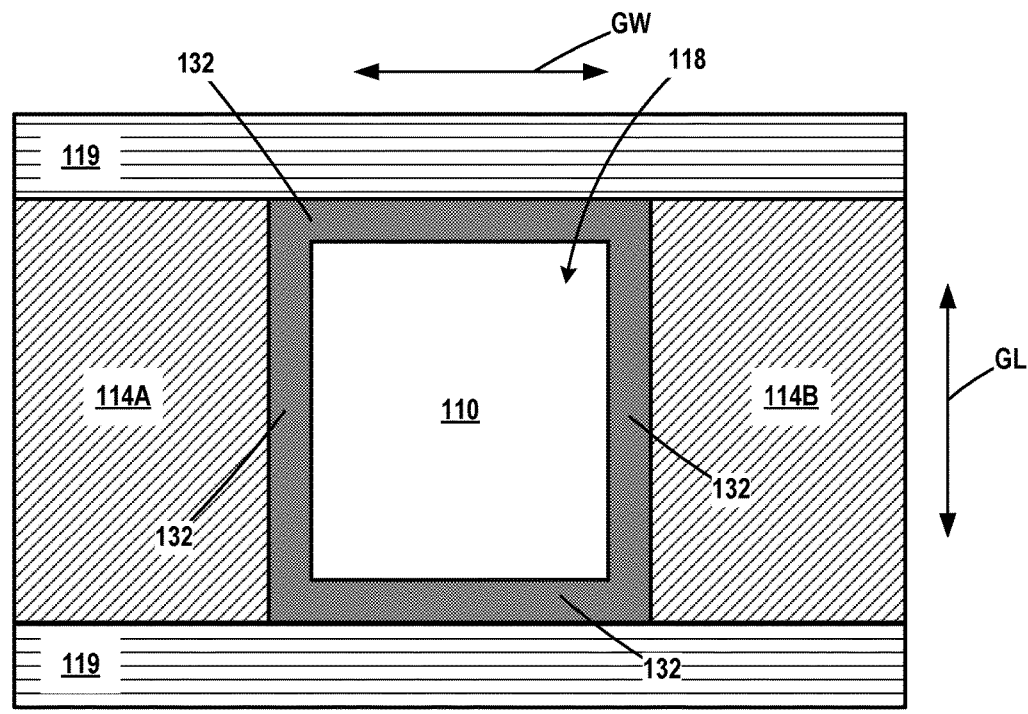

FIGS. 12, 13 and 14 depict the product after an oxidizing anneal process 130 was performed on the product to convert at least the remaining portion 114R of the material for the sacrificial gate electrode 114 positioned under or covered by the internal spacer 126A into silicon dioxide regions 132 thereby insuring that there is no conductive material or conductive pathway between the gate segments 114A, 114B. FIG. 13 is a cross-sectional view taken where indicated in FIG. 12 in a direction corresponding to the gate length (current transport) direction of the transistor devices. FIG. 14 is an enlarged plan view looking downward into the opening 118 with the internal spacer 126A removed. In one illustrative embodiment, the oxidizing anneal process 130 may be a steam anneal process that is performed at a temperature of about 600° C. for a duration of about an hour, although such processing details may vary depending upon the application. Depending upon the duration and parameters of the anneal process 130, the regions of silicon dioxide 132 may extend laterally for a distance that is greater than the width of the spacer 126A (at its base), i.e., the regions of silicon dioxide material 132 may extend farther toward the adjacent fins 106 than is depicted in the simplistic drawings depicted herein.

Figure 15:
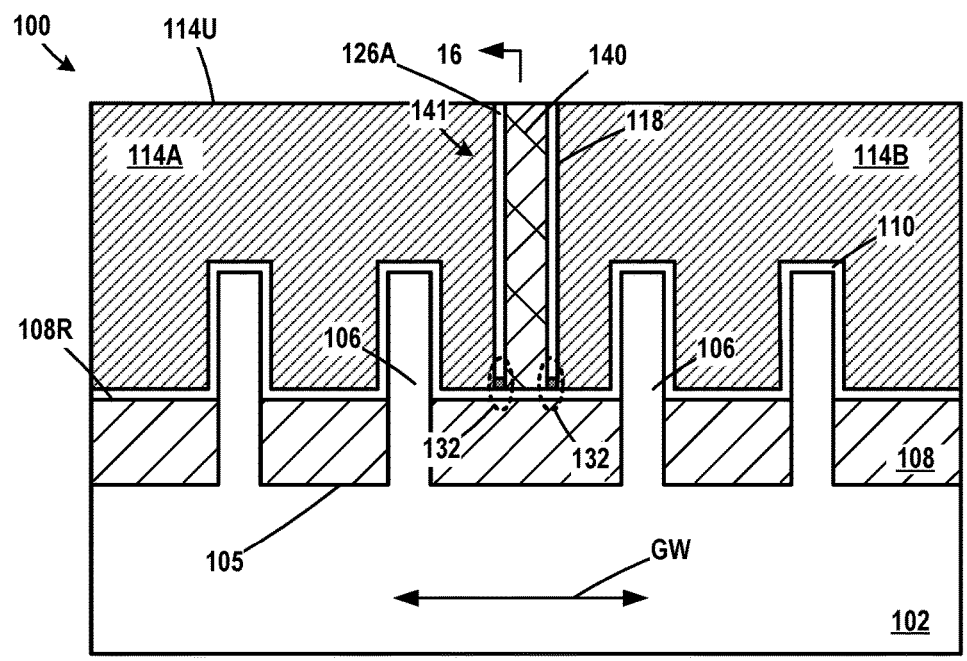
Figure 16:
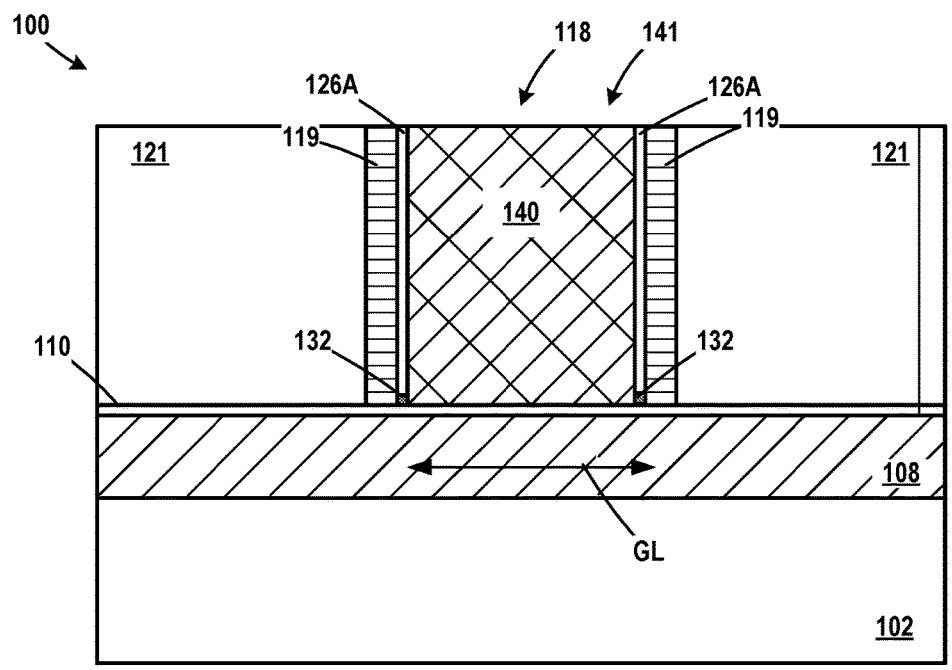
Figure 17:
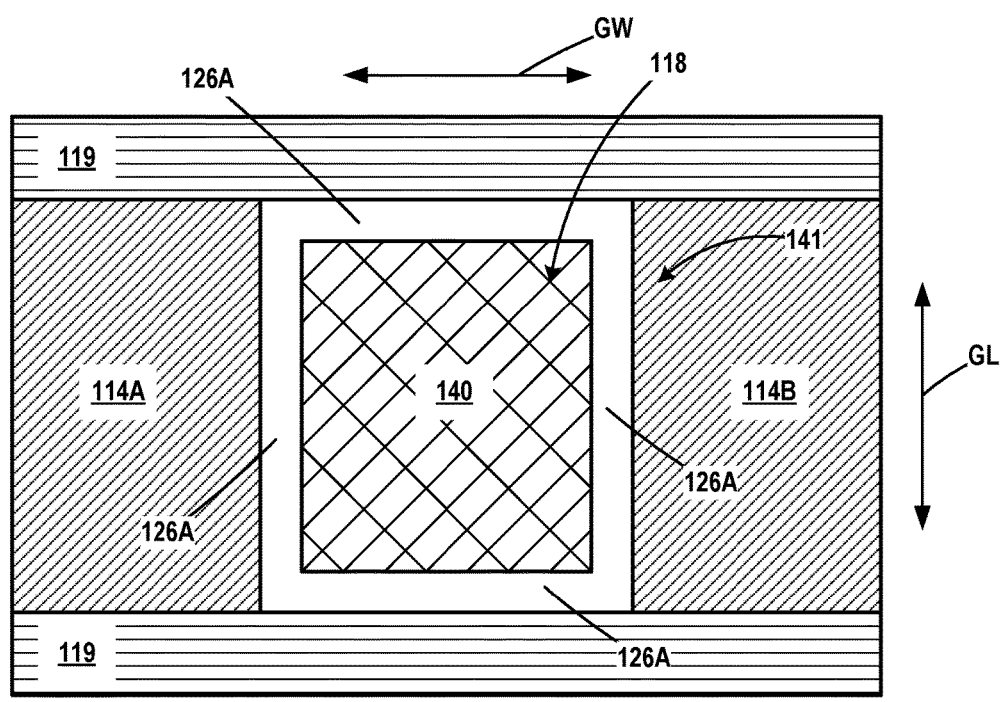

FIGS. 15, 16 and 17 depict the product after several process operations were performed. FIG. 16 is a cross-sectional view taken where indicated in FIG. 15 in a direction corresponding to the gate length (current transport) direction of the transistor devices. FIG. 17 is an enlarged plan view looking downward at the opening 118 after various materials were formed therein. First, a deposition process was performed to overfill the opening 118 with an insulating material 140, e.g., silicon nitride. Thereafter, one or more CMP process operations were performed that stopped on the upper surface 114U of the sacrificial gate electrode material layers 114A, 114B. These process operations remove excess amounts of the insulating material 140 as well as the gate cap 116. The remaining insulating material 140 positioned in the opening 118 and the internal spacer 126A collectively constitute the above-mentioned insulating gate separation structure 141. In one illustrative embodiment, the internal spacer 126A and the material 140 may be comprised of the same material, e.g., silicon nitride. Note that the materials of the sacrificial gate structure 109 on opposite sides of the insulating gate separation structure 141 are now exposed for removal.

Figure 18:
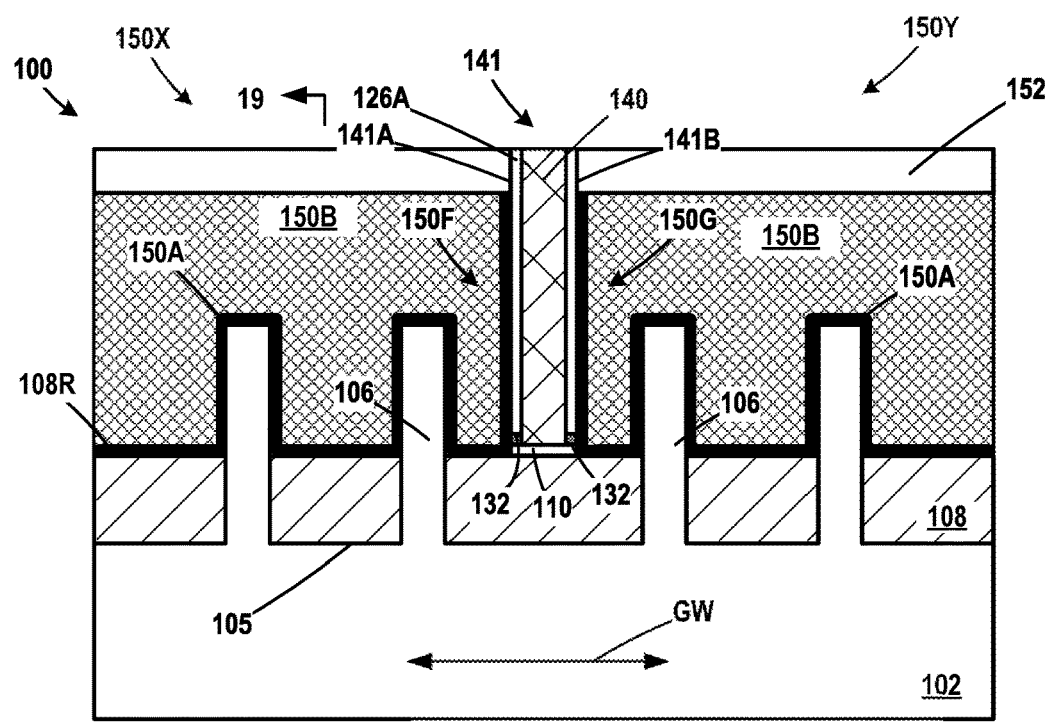
Figure 19:
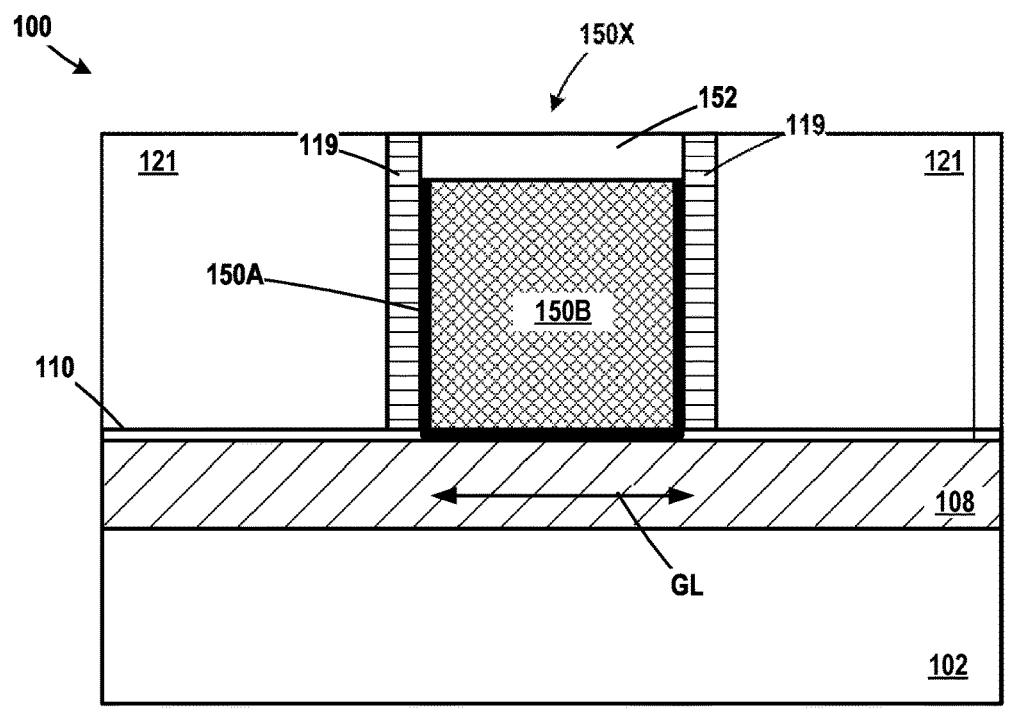

FIGS. 18 and 19 depict the product 100 after several process operations were performed to form final first and second replacement gate structures 150X, 150Y (collectively referenced using the reference numeral 150) on opposite sides of the insulating gate separation structure 141 for the transistor devices. FIG. 19 is a cross-sectional view taken through the final gate structure 150X where indicated in FIG. 18 in a direction corresponding to the gate length (current transport) direction of the transistor devices. First, a plurality of etching processes was performed to sequentially remove the exposed portions of the material for the sacrificial gate electrode 114 and the sacrificial gate insulation layer 110. This process operation defines a plurality of replacement gate cavities on opposite sides of the insulating gate separation structure 141. The gate cavities are laterally bounded (in the gate length direction) by the sidewall spacer 119 (see FIG. 19). Next, various process operations were performed to form illustrative and simplistically depicted replacement gate structures 150X, 150Y in each of the gate cavities. In general, the replacement gate structure 150 may be comprised of one or more layers of insulating material that serve (in whole or part) as the gate insulation layer 150A of the final gate structure for the transistor devices, and one or more layers of conductive material, e.g., a metal, a metal alloy, polysilicon, a work-function adjusting metal, etc., that function (in whole or part) as the conductive gate electrode 150B of the final gate structure 150 of the transistor devices. The thickness and composition of the materials for the replacement gate structure 150 may vary depending upon the particular application, and the relative thickness of the materials for the replacement gate structure 150 shown in the drawings is not to scale. In one illustrative example, the same materials for the replacement gate structure 150 may be used for the gate structure for both N- and P-type devices. In other applications, by formation of appropriate masking layers (not shown), the materials for the replacement gate structure 150 used for N- and P-type devices may be different. In one illustrative embodiment, the layer of insulating material 150A may be made of a high-k (k value of 10 or greater) insulating material, such as hafnium oxide, while the conductive gate electrode 150B may be comprised of a metal or a metal-containing material such as titanium nitride (not separately shown) that functions as a work-function adjusting layer, and a bulk layer of conductive material such as a metal, a metal alloy, tungsten or a doped polysilicon. As will be appreciated by those skilled in the art after a complete reading of the present application, the replacement gate structure 150 is intended to be representative of any type of gate structure that may be formed using replacement gate manufacturing techniques. It should be noted that the first final gate structure 150X has a first end surface 150F that contacts a first side surface 141A of the insulating gate separation structure 141, while the second final gate structure 150Y has a second end surface 150G that contacts a second side surface 141B of the insulating gate separation structure 141.

In one illustrative process flow, after formation of the materials for the replacement gate structure 150, a CMP process may be performed to remove excess materials positioned above the layer of insulating material 121 (see FIG. 19). At that point, one or more recess etching processes may be performed to remove portions of, or recess, the materials of the replacement gate structure 150 within the gate cavities to make room for a final gate cap 152. The final gate cap 152 (e.g., silicon nitride) may be formed by depositing a layer of the gate cap material so as to overfill the gate cavities and thereafter performing a CMP process to remove excess materials.

Figures 20, 21:
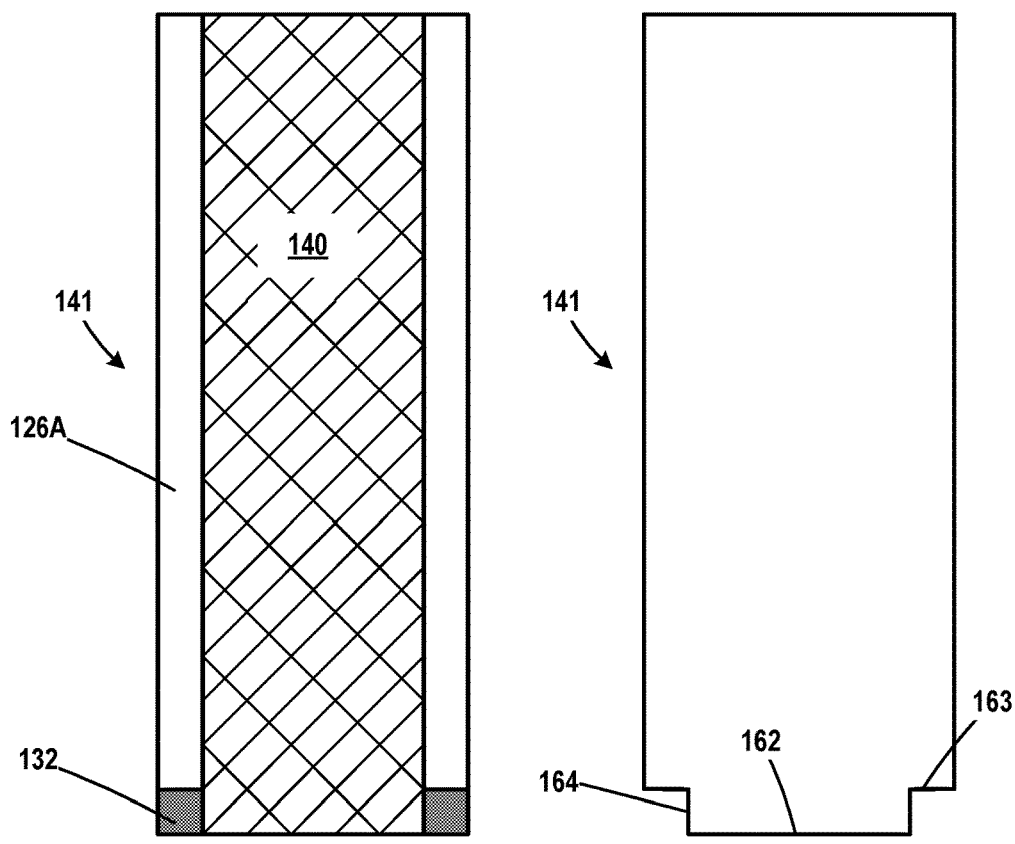
Figure 22:
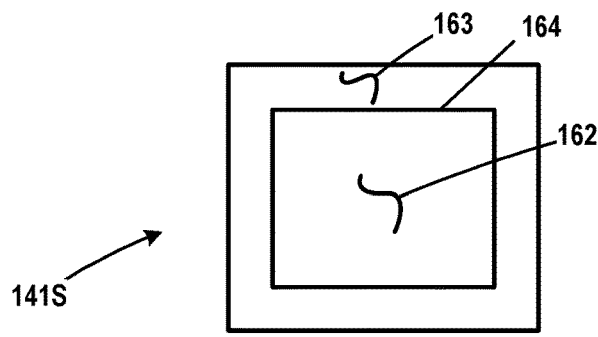

FIGS. 20 and 21 are enlarged views of one illustrative embodiment of the insulating gate separation structure 141 disclosed herein. FIG. 20 depicts the component parts of the insulating gate separation structure 141, i.e., the insulating material 140 and the internal spacer 126A, and also shows the silicon dioxide material 132 on which the insulating gate separation structure 141 is positioned. FIG. 21 just depicts an outline of the insulating gate separation structure 141. As shown in FIG. 21, the insulating gate separation structure 141 has a stepped bottom surface 141S comprised of a bottom central surface 162 that is surrounded by a recessed or notched surface 163. FIG. 22 is a plan view showing the stepped bottom surface 141S. As depicted the substantially horizontally oriented bottom central surface 162 of the stepped bottom surface 141S is positioned a first level above the substrate 102, and the substantially horizontally oriented recessed surface 163 is positioned at a second level above the substrate, wherein the second level is greater than the first level. The difference between the first and second levels corresponds approximately to the vertical thickness of the region of silicon dioxide material 132 that was formed by performing the above-described oxidizing anneal process 130. The region of silicon dioxide material 132 is also positioned adjacent a transition surface 164 between the substantially horizontally oriented bottom central surface 162 and the substantially horizontally oriented recessed surface 163.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a sacrificial gate structure above a semiconductor substrate, said sacrificial gate structure comprising a sacrificial gate insulation layer and a sacrificial gate electrode material;
   performing a first gate-cut etching process to thereby form an opening in said sacrificial gate electrode material, wherein said opening laterally separates an upper portion of said sacrificial gate electrode material into a first upper sacrificial gate electrode portion and a second upper sacrificial gate electrode portion, said opening exposing a first end surface of said first upper sacrificial gate electrode portion and a second end surface of said second upper sacrificial gate electrode portion;
   after forming said opening, forming an internal sidewall spacer in said opening so as to cover said exposed first and second end surfaces;
   after forming said internal sidewall spacer, performing a second gate-cut etching process through said opening, said second gate-cut etching process being adapted to remove said sacrificial gate electrode material;
   performing an oxidizing anneal process; and
   forming an insulating material in at least said opening.

2. The method of claim 1, wherein performing said first gate-cut etching process comprises performing said first gate-cut etching process to thereby form said opening with a bottom that stops within said sacrificial gate electrode material and said second gate-cut etching process stops on said sacrificial gate insulation layer and removes said sacrificial gate electrode material at said bottom of said opening.

3. The method of claim 1, wherein forming said internal sidewall spacer comprises forming said internal sidewall spacer such that a portion of said sacrificial gate electrode material is positioned vertically below said internal sidewall spacer.

4. The method of claim 3, wherein said oxidizing anneal process converts at least said portion of said sacrificial gate electrode material positioned vertically below said internal sidewall spacer into a region of silicon dioxide.

5. The method of claim 1, wherein performing said oxidizing anneal process comprises performing a steam anneal process.

6. The method of claim 1, wherein said insulating material in at least said opening and said internal sidewall spacer at least partially define an insulating gate separation structure.

7. The method of claim 6, further comprising:
   removing materials of said sacrificial gate structure on opposite sides of said insulating gate separation structure to form first and second replacement gate cavities on opposite sides of said insulating gate separation structure; and
   forming first and second replacement gate structures in said first and second replacement gate cavities, respectively.

8. The method of claim 7, wherein said first and second replacement gate structures comprise a high-k replacement gate insulation layer and a replacement gate electrode that comprises at least one metal-containing layer of material.

9. The method of claim 1, wherein said sacrificial gate structure is formed for one of a FinFET device, a planar transistor device or a vertical transistor device, wherein said sacrificial gate insulation layer comprises silicon dioxide and wherein said sacrificial gate electrode material comprises one of polysilicon or amorphous silicon.

10. The method of claim 9, wherein said first gate-cut etching process and said second gate-cut etching process are performed with at least one halogen-based material as an etchant material.

11. The method of claim 1, wherein said insulating material in at least said opening and said internal sidewall spacer are both comprised of a same insulating material.

12. The method of claim 1, further comprising forming a sidewall spacer adjacent to sidewalls of said sacrificial gate structure prior to forming said opening in said sacrificial gate electrode material.

13. The method of claim 1, wherein said second gate-cut etching process exposes a sidewall surface of a lower portion of said sacrificial gate electrode material positioned below said upper portion of said sacrificial gate electrode material, and wherein said exposed sidewall surface of said lower portion of said sacrificial gate electrode material is exposed to said oxidizing anneal process.

14. A method, comprising:
    forming a continuous line-type sacrificial gate structure above a semiconductor substrate, said sacrificial gate structure comprising a sacrificial gate insulation layer and a sacrificial gate electrode material;
    performing a first gate-cut etching process to thereby form an opening in said sacrificial gate electrode material, said opening having a bottom that stops within said sacrificial gate electrode material, wherein said opening laterally separates an upper portion of said sacrificial gate electrode material into a first upper sacrificial gate electrode portion and a second upper sacrificial gate electrode portion, exposes a first end surface of said first upper sacrificial gate electrode portion, and exposes a second end surface of said second upper sacrificial gate electrode portion;
    after forming said opening, forming an internal sidewall spacer in said opening so as to cover said exposed first and second end surfaces and such that a lower portion of said sacrificial gate electrode material is positioned vertically below said internal sidewall spacer;
    after forming said internal sidewall spacer, performing a second gate-cut etching process that stops on said sacrificial gate insulation layer and removes said sacrificial gate electrode material at said bottom of said opening;
    performing an oxidizing anneal process to convert at least said portion of said sacrificial gate electrode material positioned vertically below said internal sidewall spacer into a region of silicon dioxide; and
    forming an insulating material in at least said opening.

15. The method of claim 14, wherein performing said oxidizing anneal process comprises performing a steam anneal process.

16. The method of claim 14, wherein said insulating material in at least said opening and said internal sidewall spacer at least partially define an insulating gate separation structure.

17. The method of claim 16, further comprising:
    removing materials of said sacrificial gate structure on opposite sides of said insulating gate separation structure to form first and second replacement gate cavities on opposite sides of said insulating gate separation structure; and
    forming first and second replacement gate structures in said first and second replacement gate cavities, respectively.

18. The method of claim 14, further comprising forming a sidewall spacer adjacent to sidewalls of said continuous line-type sacrificial gate structure prior to forming said opening in said sacrificial gate electrode material.

19. The method of claim 14, wherein said second gate-cut etching process exposes a sidewall surface of said lower portion of said sacrificial gate electrode material positioned vertically below said internal sidewall spacer, and wherein said exposed sidewall surface of said lower portion of said sacrificial gate electrode material is exposed to said oxidizing anneal process.

20. A method, comprising:
    forming a sacrificial gate structure above a semiconductor substrate, said sacrificial gate structure comprising a sacrificial gate insulation layer and a sacrificial gate electrode material;
    forming a sidewall spacer adjacent to sidewalls of said sacrificial gate structure;
    after forming said sidewall spacer, performing a first gate-cut etching process to thereby form an opening that extends through an upper portion of said sacrificial gate electrode material and laterally separates said upper portion into a first upper sacrificial gate electrode portion and a second upper sacrificial gate electrode portion, said opening exposing a first end surface of said first upper sacrificial gate electrode portion of said sacrificial gate electrode material and exposing a second end surface of said second upper sacrificial gate electrode portion of said sacrificial gate electrode material;
    after forming said opening, forming an internal sidewall spacer in said opening, said internal sidewall spacer covering said exposed first and second end surfaces of said respective first and second upper sacrificial gate electrode portions;
    after forming said internal sidewall spacer, performing a second gate-cut etching process through said opening so as to extend said opening through a remaining lower portion of said sacrificial gate electrode material and expose said sacrificial gate insulation material positioned therebelow, said extended opening exposing sidewall surfaces of said remaining lower portion;
    performing an oxidation process on said exposed sidewall surfaces of said remaining lower portion so as to convert part of said remaining lower portion into an insulating material;
    forming an insulating material in said extended opening, said insulating material and said internal sidewall spacer at least partially defining an insulating gate separation structure;
    removing materials of said sacrificial gate structure on opposite sides of said insulating gate separation structure to form first and second replacement gate cavities on opposite sides of said insulating gate separation structure; and
    forming first and second replacement gate structures in said first and second replacement gate cavities, respectively.

* * * * *